United States Patent
Ishikawa

(10) Patent No.: US 6,711,042 B2
(45) Date of Patent: Mar. 23, 2004

(54) SEMICONDUCTOR DEVICE WHEREON MEMORY CHIP AND LOGIC CHIP ARE MOUNTED, MAKING TESTING OF MEMORY CHIP POSSIBLE

(75) Inventor: Katsuya Ishikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/096,937

(22) Filed: Mar. 14, 2002

(65) Prior Publication Data

US 2003/0043612 A1 Mar. 6, 2003

(30) Foreign Application Priority Data

Sep. 5, 2001 (JP) .......................................... 2001-268918

(51) Int. Cl.[7] ................................................. G11C 5/02
(52) U.S. Cl. ...................... 365/51; 365/63; 365/189.01; 365/201; 365/233
(58) Field of Search ........................... 365/51, 63, 201, 365/233, 189.05

(56) References Cited

U.S. PATENT DOCUMENTS

| | | | |
|---|---|---|---|
| 5,910,181 A | | 6/1999 | Hatakenaka et al. ........ 714/718 |
| 5,991,232 A | * | 11/1999 | Matsumura et al. ........ 365/233 |
| 6,078,514 A | * | 6/2000 | Takemae et al. ............... 365/63 |
| 6,216,240 B1 | * | 4/2001 | Won et al. ................... 714/718 |
| 6,272,069 B2 | * | 8/2001 | Tomita et al. ............... 365/233 |
| 6,353,565 B2 | * | 3/2002 | Ito ............................. 365/201 |

\* cited by examiner

Primary Examiner—Michael S. Lebentritt
Assistant Examiner—Pho M. Luu
(74) Attorney, Agent, or Firm—Arent Fox Kintner Plotkin & Kahn, PLLC

(57) ABSTRACT

A semiconductor device includes a logic chip having a prescribed function and a memory chip for storing data are mounted in a common package. The logic chip and memory chip are connected through memory access terminals, which are a control signal terminal, address terminal, and data terminal. The logic chip has a logic circuit having prescribed functions and a memory chip testing circuit for performing operation tests on the memory chip. The logic chip also has a selector-output circuit for selecting a memory access signal from the logic circuit and a memory testing access signal from the memory chip testing circuit to output the selected signal to the memory access terminal.

18 Claims, 13 Drawing Sheets

SEMICONDUCTOR DEVICE WHEREON MEMORY CHIP AND LOGIC CHIP ARE MOUNTED, MAKING TESTING OF MEMORY CHIP POSSIBLE

BACKGROUND OF THE INVENTION

1. Field of the Invention

This invention relates to a multi-chip package (MCP) or multi-chip module (MCM) semiconductor device whereon a memory chip and logic chip are mounted, and to a semiconductor device wherewith it is possible to test the memory chip after accommodation in the package.

2. Description of the Related Art

Semiconductor devices called MCPs and MCMS are becoming widely used in which large-capacity memory chips and logic chips having specific functions such as functions for image processing and the like are mounted in the same package. FIG. 1 is a diagram of the configuration of a conventional MCP or MCM semiconductor device. In a common package 1 are mounted a high-speed, large-capacity memory chip 3 such as an SDRAM and a logic chip 2 having specific functions. In the logic chip 2 are provided a logic circuit 2A and an input/output circuit 2B for the memory chip 3, and around these circuits are further provided input/output terminals 20 to 25. And inside the memory chip 3 is deployed a cell array (not shown), while input/output terminals 32 to 37 are deployed about the periphery thereof.

In the package 1, external terminals 10 for connecting to the outside are provided. The external terminals 10 are connected to input/output terminals 20 of the logic chip 2 and to power supply terminals 36 and 37 of the memory chip 3 and the like via bonding wires or connection bumps. The memory chip 3 inputs and outputs data in response to access requests from the logic chip 2. Accordingly, the clock terminal 32, control signal terminal 33, address terminal 34, and data terminal 35 of the memory chip 3 are connected to corresponding terminals 22 to 25 of the logic chip.

Thus the memory chip 3 is only accessed from the logic chip 2, therefor the control signal terminal 33, address terminal 34, and data terminal 35 are connected to the logic chip 2 and are not connected directly to the external terminals of the package 1. Such a semiconductor device performs prescribed processing on prescribed data, stores the results thereof in the memory chip 3, and outputs those results to the outside.

Because the control signal terminal 33, address terminal 34, and data terminal 35 of the memory chip 3 are not connected to the outside of the package 1, as described above, the memory chip 3 cannot be adequately tested. Even if it is possible to conduct limited tests such as on the basic access operations to the memory chip 3 or the like, using the functions of the logic circuit 2A in the logic chip 2, tests cannot be performed on ordinary operations synchronized to high-frequency clock.

Even if limited tests could be performed on the memory chip 3 in the wafer condition, after it is mounted to the package 1, and after burn-in has been performed to enhance reliability, various tests cannot be performed as when a memory chip is mounted by itself.

It is possible to provide a built-in self testing circuit (BIST) inside the memory chip 3, but such a BIST circuit only performs operation tests inside the memory chip 3, and operation tests cannot be performed inclusive of determining whether the memory chip is operating normally to accesses from the logic chip 2 under the delay characteristics resulting from such connection means as wires or in-board interconnections that connect the logic chip 2 and the memory chip 3.

SUMMARY OF THE INVENTION

Thereupon, an object of the present invention is to provide a semiconductor device wherein a logic chip and memory chip are mounted in the same package and wherewith memory chip operation tests can be performed effectively.

Another object of the present invention is to provide a semiconductor device wherein a logic chip and memory chip are mounted in the same package, the memory chip is only accessed from the logic chip, and access operations from the logic chip to the memory chip can be performed effectively.

In order to attain the objects stated above, one aspect of the present invention is a semiconductor device wherein a logic chip having prescribed functions and a memory chip for storing data are mounted in a common package, wherein the logic chip and memory chip are connected through such memory access terminals which are a control signal terminal, address terminal, and data terminal and the like, and the logic chip has a logic circuit having the prescribed functions and a memory chip testing circuit for performing operation tests on the memory chip.

In a more preferable embodiment, the logic chip also has a selector-output circuit for selecting a memory access signal from the logic circuit and a memory testing access signal from the memory chip testing circuit to output the selected signal to the memory access terminal.

Based on the invention described in the foregoing, during ordinary operations, memory access signals from the logic circuit are sent to the memory chip via the selector-output circuit and access operations from the logic chip to the memory chip are performed, whereas, during memory chip testing, memory testing access signals from the memory chip testing circuit provided inside the logic chip are sent to the memory chip via the selector-output circuit, and access operations from the logic chip to the memory chip are tested. Accordingly, access operations, inclusive of delay times due to connection means between the logic chip and the memory chip, can be tested. In other words, even after package mounting and burn-in, high-speed access operation testing can be performed effectively.

In a preferable embodiment of the invention described in the foregoing, the logic chip also has a test control circuit for generating a first selection signal for selecting one or other of the memory access signal and the memory testing access signal in the selector-output circuit, in response to a test mode select signal from the outside.

In an even more preferable embodiment, the logic circuit has a plurality of macro circuits and random logic circuits having prescribed functions, and a macro selector for selecting such macro circuit or random logic circuit and connecting the selected circuit to an external terminal of the package, and the test control circuit generates a second selection signal for selecting from among the plurality of macro circuits and random logic circuits in the macro selector, in response to a test mode select signal from the outside.

In an even more preferable embodiment, the logic circuit has a plurality of logic circuit memories, and a memory selector for selecting those logic circuit memories and connecting the selected memory to an external terminal of the package, and the test control circuit generates a third selection signal for selecting from among the plurality of logic circuit memories in the memory selector, in response to a test mode select signal from the outside.

In a more preferable embodiment, moreover, the memory chip testing circuit has a memory chip control circuit for generating control signals for specifying memory chip operations, address signals, and write data according to a test mode, and a test data judgment circuit for comparing read data output by the memory chip in response to a read-out control signal from the memory chip control circuit and expected value data from the memory chip control circuit to output either match or mismatch to the outside of the package.

The memory chip testing circuit noted above also has an initialization circuit for initializing the memory chip, a self test circuit for testing the test data judgment circuit, and a test mode setting circuit for setting the test mode. The initialization circuit, self test circuit, and test mode setting circuit send respective mode signals to the memory chip control circuit in accordance with control data from outside the package. The memory chip control circuit generates the control signals, address signals, and write signals according to those mode signals.

In a more preferable embodiment of the invention described in the foregoing, the memory chip has a burn-in entry terminal for causing the interior thereof to enter into a burn-in operation. The memory chip also has a memory non-operate entry terminal for entering into a mode wherein the memory chip does not output an output signal during logic circuit testing. Both the burn-in entry terminal and the memory non-operate entry terminal are connected to an external terminal of the package. Thus, when the semiconductor device is being tested, the interior of the memory chip can easily be made to enter a burn-in operation mode or non-operation mode.

In a more preferable embodiment of the invention described in the foregoing, the logic chip has an inhibiting terminal for stopping internal operations of the logic chip, the inhibiting terminal is connected to an external terminal of the package. Thus, when the memory chip is being tested, it is prevented that the interior of the logic chip operating, power supply noise and the like is generated, so that the memory chip testing is subjected to adverse effects according to the noise.

DESCRIPTION OF THE PREFERRED EMBODIMENTS

Embodiment aspects of the present invention are now described with reference to the drawings. The protective scope of the present invention, however, is not limited to or by the following embodiment aspects, but extends to the inventions described in the claims and to what is equivalent thereto.

Figure 1:
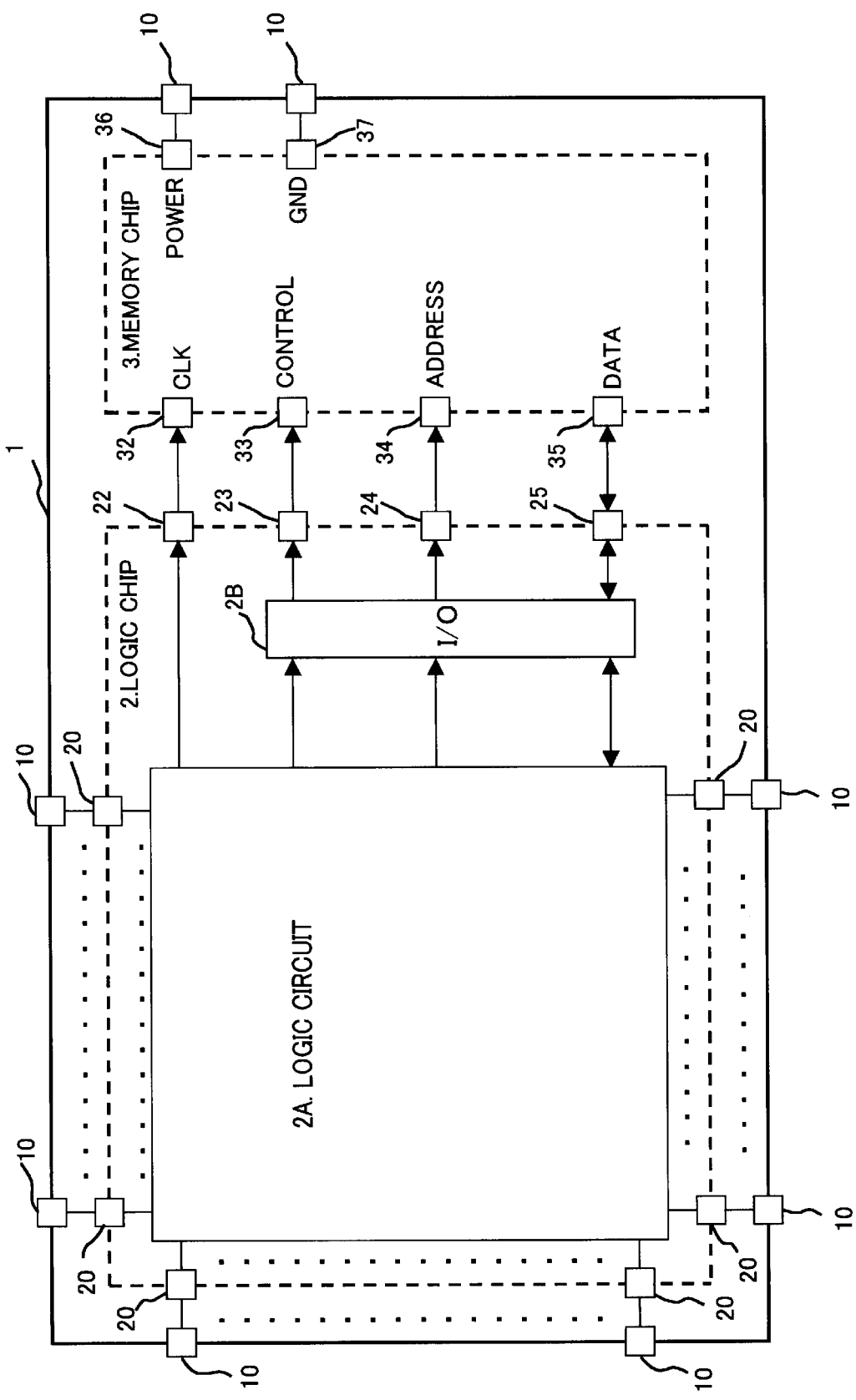
FIG. 1 is a diagram of the configuration of a conventional MCP or MCM semiconductor device.
Figure 2:
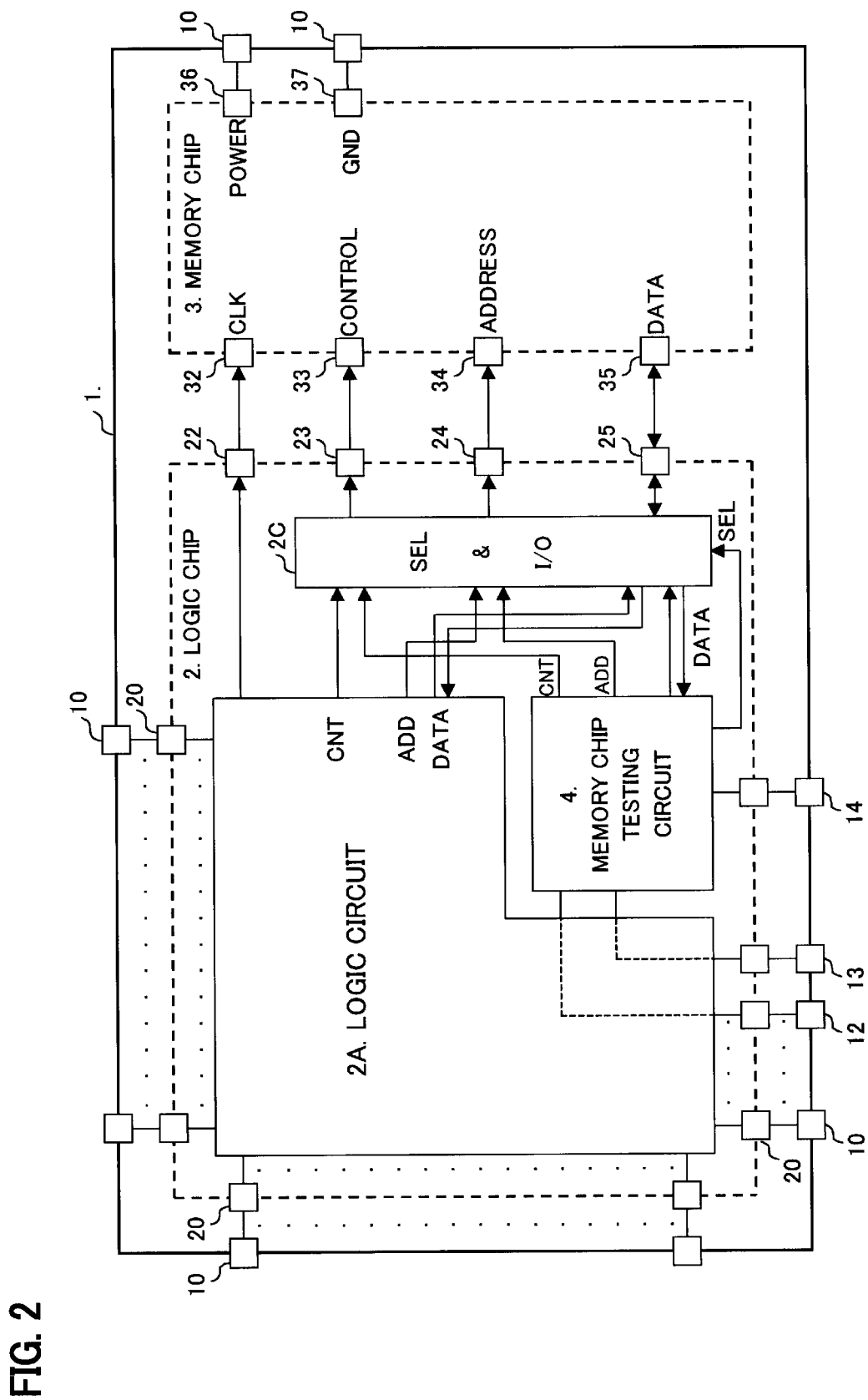
FIG. 2 is an overall configuration diagram of a semiconductor device in this embodiment aspect.

FIG. 2 is an overall configuration diagram of a semiconductor device in this embodiment aspect. Places that are the same as in FIG. 1 are given the same reference number. In the semiconductor device diagrammed in FIG. 2, a logic chip 2 and memory chip 3 are mounted inside a common package 1, a plurality of input/output terminals 20 of the logic chip 2 are connected to external terminals 10 of the package 1, and the power supply terminal 36 and ground terminal 37 of the memory chip 3 are connected to the external terminals 10 of the package 1. The memory chip 3 is accessed from the logic chip 2, and a clock terminal 22, control signal terminal 23, address terminal 24, and data terminal 25 of the logic chip 2 are connected respectively to the corresponding terminals 32, 33, 34, and 35 of the memory chip 3.

The logic chip 2 has a logic circuit 2A having prescribed functions, a memory chip testing circuit 4 for performing operation tests on the memory chip 3, and a selector input/output circuit 2C for switching between access signals from the logic circuit 2A and test access signals from the memory chip testing circuit 4.

During ordinary operations, the selector input/output circuit 2C selectively outputs a control signal CNT, address signal Add, and write data DATA from the logic circuit 2A, and sends read data DATA from the memory chip 3 to the logic circuit 2A. During memory chip testing, on the other hand, the selector input/output circuit 2C selectively outputs a control signal CNT, address signal Add, and write data DATA from the memory chip testing circuit 4, and sends read data DATA from the memory chip 3 to the memory chip testing circuit 4. For that reason, the memory chip testing circuit 4 sends the select signal SEL to the selector input/output circuit 2C. The read data and write data DATA, moreover, are on separate signal lines between the logic circuit 2A and the selector input/output circuit 2C, but on a common bidirectional signal line between the selector input/output circuit 2C and the memory chip 3.

Accordingly, the memory chip testing circuit 4 can perform operation tests on the memory chip 3 that comprehend the delay characteristics in the input/output circuitry inside the logic chip 2 and delay characteristics of the connection means between the logic chip 2 and memory chip 3, under conditions equivalent to those in effect during memory access from the logic circuit during ordinary operations. Since the access to the memory chip testing circuit 4, moreover, is possible by using the plurality of input/output terminals 12 and 13 and the like which the logic circuit 2A has, there is no need to provide special external terminals for a memory chip testing circuit. In other words, during operation tests on the memory chip 3, the operations of the logic chip 2 are stopped, wherefore the input/output terminals 12 and 13 of the logic chip 2 can be used for the memory chip testing circuit 4. In cases where an external terminal can be used, however, an external terminal 14 may be provided for direct connection to the memory chip testing circuit 4.

Thus, by deploying the memory chip testing circuit inside the logic chip 2, operation tests can be performed effectively on a memory chip which has no access signal terminal connected to an external terminal of the package, under conditions close to normal operation conditions.

When the memory chip 3 is a clock synchronized DRAM such as an SDRAM, furthermore, the input/output of the control signals, addresses, and data is performed in synchronization with a clock signal, wherefore a clock signal CLK is sent from the logic chip 2 to the memory chip 3. When the memory chip 3 does not require the clock signal CLK, moreover, there are cases where a strobe signal will be sent from the memory chip 3 to the logic chip 2 to mark the timing for outputting read data.

Figure 3:
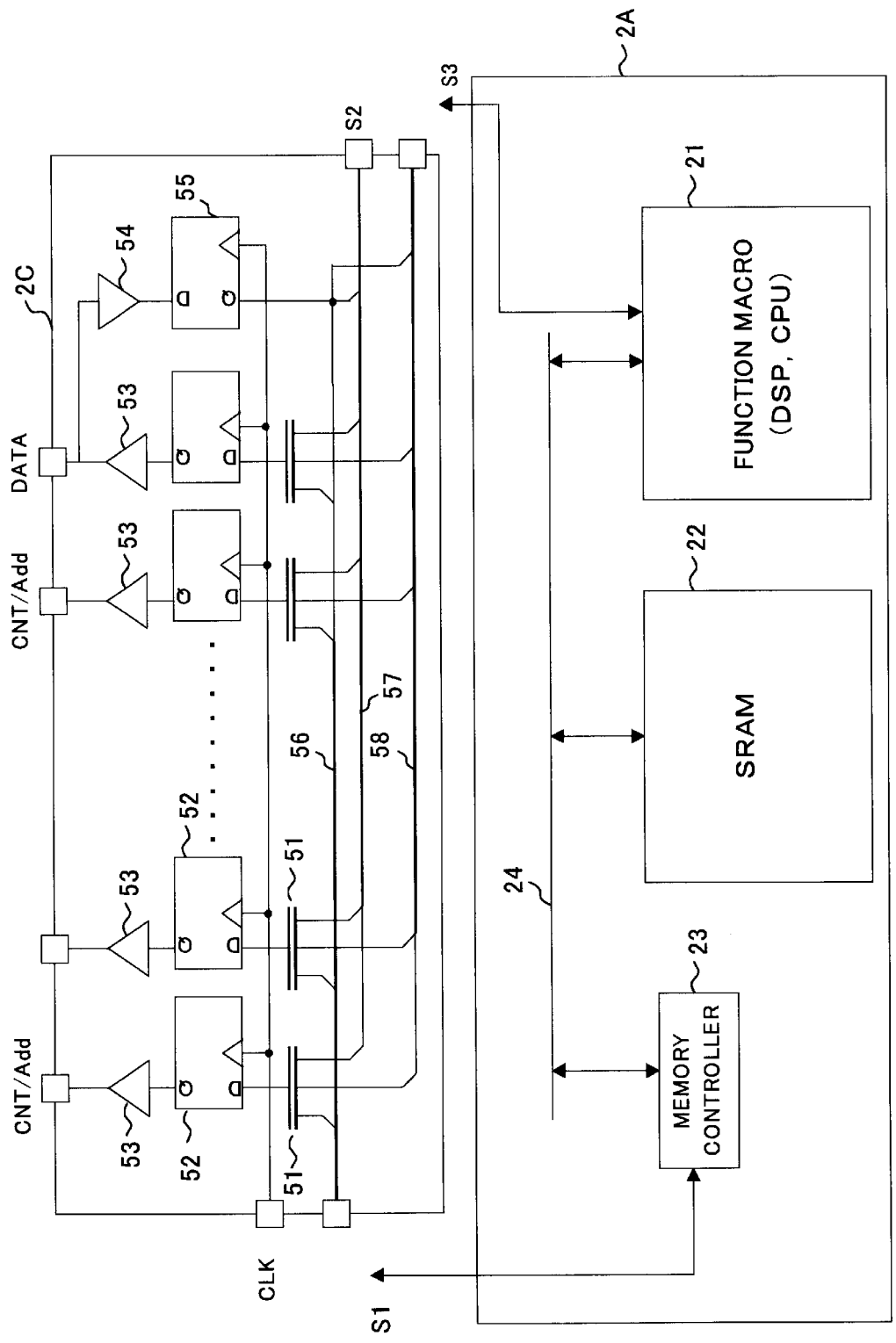
FIG. 3 is a diagram of a first example of a selector input/output circuit.

FIG. 3 is a diagram of a first example of a selector input/output circuit. This selector input/output circuit 2C has selector circuits 51 for selecting one or other of a memory access signal S1 from the logic circuit 2A during ordinary operations and a test access signal S2 from the memory chip testing circuit 4 during memory chip testing, flip flops 52 constituting holding means for temporarily holding those signals, and output buffer circuits 53 for outputting the signals held by the flip flops 52 to the output terminals 23, 24, and 25. The selector circuit 51 are also configured so that it can select, in addition to the memory access signal S1 and test access signal S2 noted above, a signal S3 from an internal function macro circuit 21 during logic chip 2 wafer testing. The selector circuit 51 selects one or other of the signals S1, S2, and S3, in accordance with a select signal (not shown).

The selector input/output circuit 2C, on the other hand, has an input buffer circuit 54 for inputting read data DATA from the memory chip 3 and a flip flop 55 for holding those data. The outputs from the flip flop 55 are sent, respectively, to the logic circuit 2A, the memory chip testing circuit 4, and the function macro circuit 21 inside the logic circuit 2A.

Furthermore, signal lines 56, 57, and 58, for the memory access signal S1 from the logic circuit, the test access signal S2 from the memory chip testing circuit, and the signal S3 from the function macro circuit 21 during logic circuit testing, respectively, are configured with a plurality of bits.

The logic circuit 2A has, for example, a plurality of function macro circuits 21, a plurality of memories (SRAMS) 22, an internal bus 24 for connecting those, and a memory controller 23 for controlling access to the memory chip 3 during ordinary operations. The memory controller 23 and various other circuits (not shown) are here called the random logic circuits.

For the logic chip 2 also, prescribed tests are required, in the wafer stage and after package mounting. For that reason, the selector input/output circuit 2C diagrammed in FIG. 3 configures a selector circuit 51 so that it is possible for the plurality of function macro circuits 21 and the logic chip to be connected to the outside. Due to that configuration, the logic chip 2 has prescribed operation tests performed on the function macro circuits 21 in the wafer stage.

Figure 4:
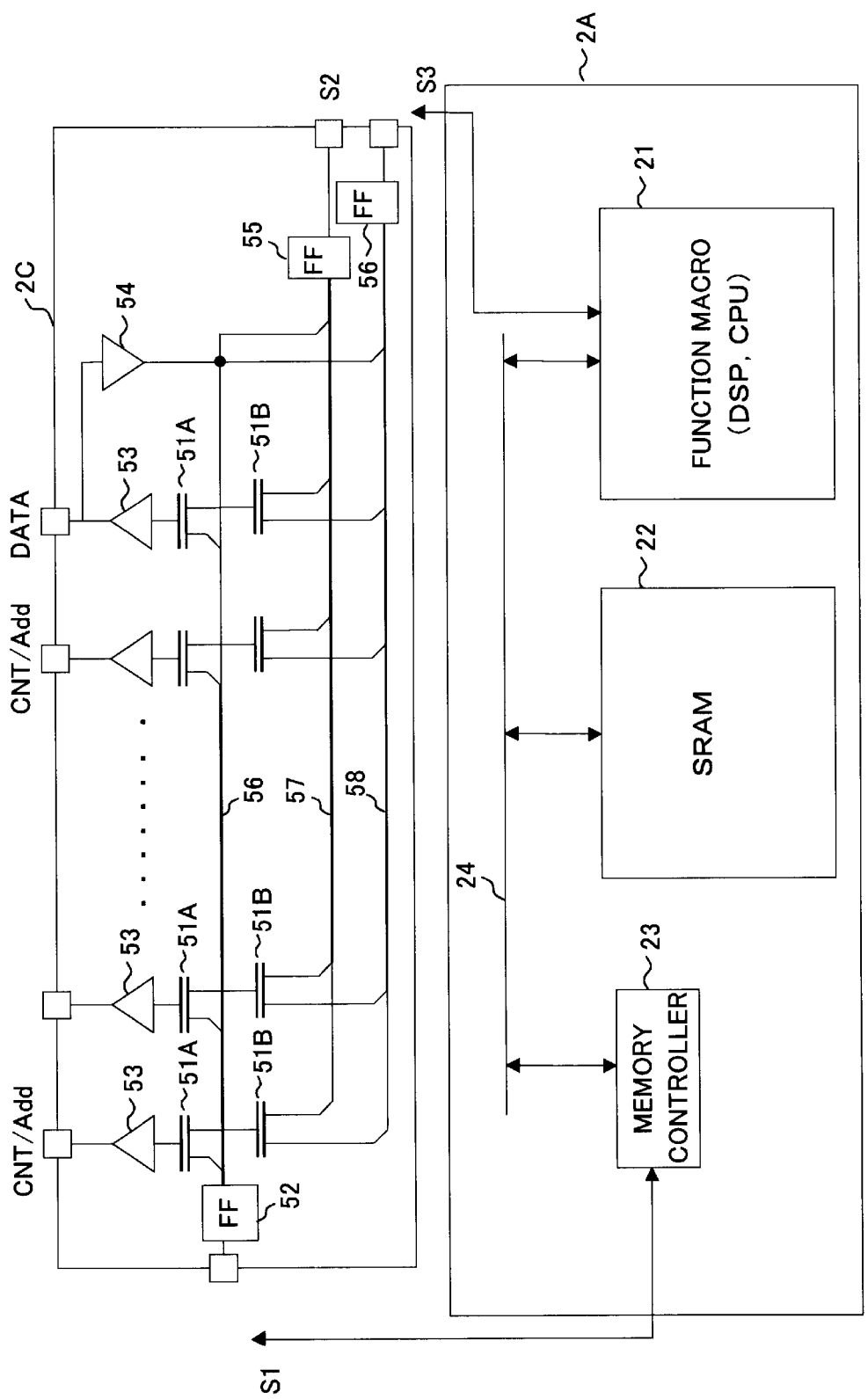
FIG. 4 is a diagram of a second example of a selector input/output circuit.

FIG. 4 is a diagram representing a second example of a selector input/output circuit. In this selector input/output circuit 2C, the selectors are divided into selectors 51B for selecting one or other of the test access signal S2 from the memory chip testing circuit during memory chip testing and the signal S3 during logic circuit testing, and selectors 51A for selecting one or other of the signal selected by the selector 51B and the access signal S1 from the logic circuit 2A during ordinary operations. The outputs from the selectors 51A are input directly to the output buffers 53. The flip flop 52 that temporarily holds the access signal S1 during ordinary operations, the flip flop 55 that temporarily holds the test access signal S2 from the memory chip testing circuit, and a flip flop 56 for temporarily holding the signal S3 during logic circuit testing in the wafer condition are provided, respectively, in the stage prior to the selectors 51A and 51B. The input circuit configuration is such that the outputs of the input buffer circuit 54 are sent respectively to the flip flops 52, 55, and 56.

With the second example of selector input/output circuit diagrammed in FIG. 4, the delay affecting the access signal S1 sent from the logic circuit 2A during ordinary operations can be kept to a minimum. It is necessary, however, to provide a flip flop for each of the signals S1, S2, and S3, and by that measure it becomes difficult to regulate the delay amount. With the selector input/output circuit diagrammed in FIG. 3, on the other hand, a flip flop is provided for each output butter circuit, so it becomes easy to regulate the timing.

Figure 5:
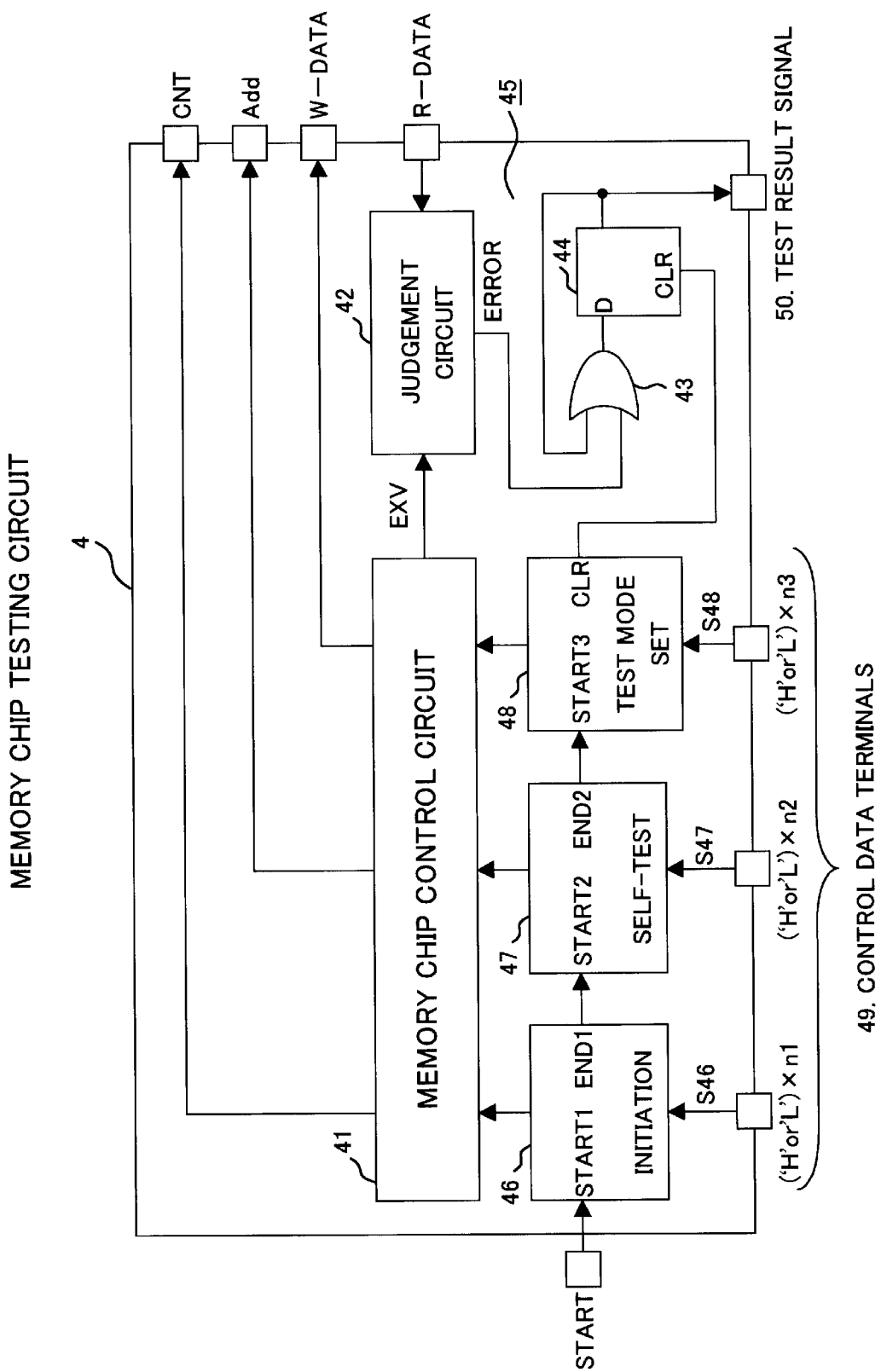
FIG. 5 is a configuration diagram of a memory chip testing circuit.

FIG. 5 is a configuration diagram of a memory chip testing circuit. The memory chip testing circuit 4 is provided inside the logic chip 2 and generates test access signals for memory chip testing. In other words, the logic chip 2 and memory chip 3 are mounted in a common package 1, and this memory chip testing circuit 4 is used to determine whether access operations from the logic chip 2 to the memory chip 3 are normal or not after the memory chip 3 has been subjected to stress in a burn-in mode, for example. This memory chip testing circuit 4 can be used without limitation to testing after burning in, however.

The memory chip testing circuit 4 has a memory chip control circuit 41 for generating control signals CNT, addresses Add, and write data W-DATA to the memory chip, a judgment circuit 42 to determine whether the read data R-DATA and the expected value EXV match or not, OR gate 43, and a flip flop 44 for holding the judgment result when there is a mismatch. By the judgment circuit 42, OR gate 43, and flip flop 44, a test data judgment circuit 45 is configured.

The memory chip testing circuit 4 also has an initialization circuit 46 for initializing the memory chip, a self test circuit 47 for performing function checks on the memory chip control circuit 41 and test data judgment circuit 45, and a test mode setting circuit 48 for setting the test mode.

Figure 6:
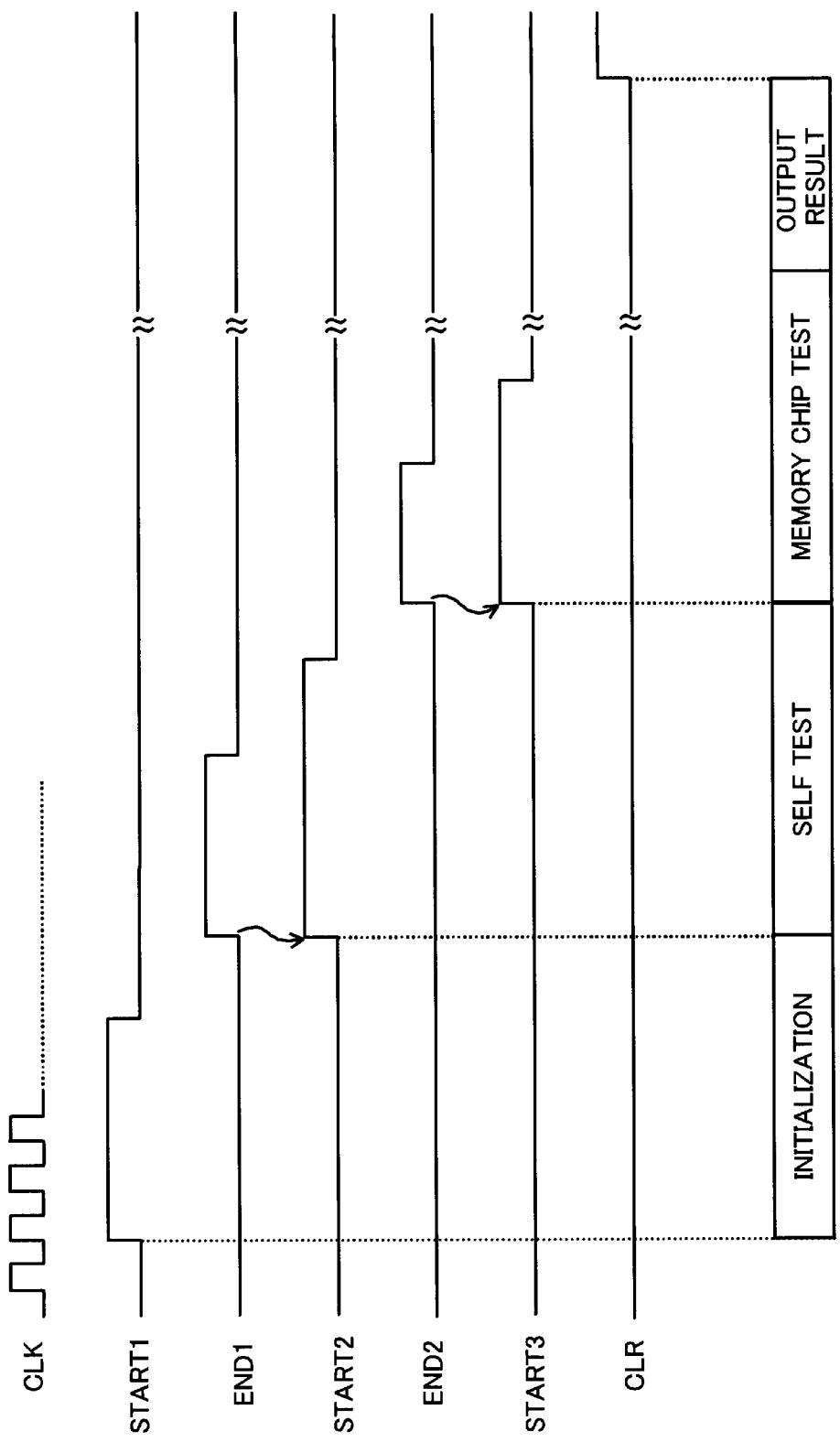
FIG. 6 is a timing chart for the operations of a memory chip testing circuit 4.

FIG. 6 is an operation timing chart for the memory chip testing circuit 4. In response to a start signal START1 from the outside, first the initialization circuit 46 fetches an initializing setting signal S46, and sends control signals necessary to the set initialization to the memory chip control circuit 41. Next, the self test circuit 47, in response to a start signal START2, fetches a self test setting signal S47, and sends control signals necessary to the set self test to the memory chip control circuit 41. And, last of all, the test mode setting circuit 48, in response to a start signal START3, fetches a test mode setting value S48, and sends control signals corresponding to the set test mode to the memory chip control circuit 41.

The initialization circuit 46 outputs an end signal END1 when the initialization operations are finished, and that is input as the start signal START2 of the self test circuit 47. The self test circuit 47, in turn, outputs an end signal END2 when the self test is finished, and that is input as the start signal START3 of the test mode setting circuit 48.

For a large-capacity high-speed DRAM such as an SDRAM, input data in several tens of M (mega) patterns, for example, must be provided to the memory chip 3 so that power is provided to the memory chip 3, and initialization, self testing, and operation testing can be performed in that order. For that reason, in order for an external tester to input these several tens of M patterns to the memory chip 3, a large-capacity memory must be built in, which places limitations on the testers that can be used. Also, when testing is performed in an ordinary testing cycle that modifies a clock signal and data at every operating cycle of the tester, an enormous amount of time is required to execute the several tens of M patterns noted above.

For that reason, testers in recent years, although only one data modification can be made per test cycle, have a double clock mode or triple clock mode capable of supplying multiple clock signals to the device being tested. In such a mode, however, it is only possible merely to supply high-speed clock signals, and the time required to supply several tens of M patterns of data cannot be shortened.

Thereupon, with the memory chip testing circuit in this embodiment aspect, instead of changing test control data to timing synchronized to a clock signal, an initializing setting value S46, self test setting value S47, and test mode setting value S48 are supplied fixedly, and, when the start signal START is received, those setting values S46, S47, and S48 are respectively fetched and, in accordance with those setting values, the memory chip control circuit 41 automatically generates a control signal CNT, address Add, and write data W-DATA to the memory chip.

As diagrammed in the timing chart FIG. 6, the tester, after first setting data to external terminals for inputting the setting values S46, S47, and S48, simply supplies a start signal START, thereafter only supplies the clock signal CLK, and needs not modify the setting data in synchronization with the clock signal. Accordingly, not only can the testing time be shortened, using the double clock mode or triple clock mode of the tester, but there is no need to have memory capacity for holding several tens of M patterns of data in the tester.

The initialization operations after turning on the power comprise an operation to reset the nodes inside the memory chip, and operations to set the operation mode inclusive of burst length, burst type, and CAS latency. The initializing setting value S46 includes mainly the operation mode setting data described in the foregoing. And, in the case of an SDRAM, combinations of control signals CNT needed for the initialization operation, such as no operation NOP, precharge PRE, refresh REF, and mode set MODSET, are generated by the memory chip control circuit 41.

With a self test operation, a test is performed to determine whether or not the test data judgment circuit 45 can normally detect an error and output the test result, by writing the data W-DATA to a prescribed address, reading out those data R-DATA, and comparing the expected value EXV with the write data. In other words, self test operation means meant a test of the memory chip testing circuit 4. In order to effect this self test operation, the memory chip control circuit 41 generates the control signals CNT necessary for the write operation and read operation, combining signals such as active ACT, write WR, precharge PRE, and refresh REF, for example, and generates the address Add and write data W-DATA associated therewith.

Test modes include various modes that have been known for some time. Examples of such modes include, for example, (1) a mode wherein data "1" are written while incrementing the address, then those data are read out while decrementing the address, and a check is made as to whether or not the data "1" were read out normally, (2) a mode that is the same as the mode described above wherein the data "0" are written and read out, and (3) a mode wherein data are read out while incrementing the address, inverse data are written simultaneously to that cell, then those data are read out while decrementing the address, and a check is made as to whether or not the data were read out normally.

The test modes described above involve repeating the operations of incrementing and decrementing an address and of writing and reading. Accordingly, the memory chip control circuit 41 generates combinations of control signals CNT such as active ACT, write WR, precharge PRE, and refresh REF.

The test data judgment circuit 45, if even a 1-bit error is detected in one memory chip test, holds that in the flip flop 44. Accordingly, the tester can detect whether or not a defective bit exists by reading the data held by the flip flop 44, either during the memory chip test or when that test is finished. As a consequence, this test data judgment circuit 45 outputs minimum judgment results.

The test data judgment circuit is not limited to the example described in the foregoing, but may be configured also so that much error information is held. The address at the time the error occurred can be held, or the error occurrence frequency can be held, for example.

When the initialization, self test, and series of test operations in the memory chip tests diagrammed in FIG. 6 are finished, the tester modifies the setting values S46, S47, and S48, again sends a start signal START, and causes the memory chip testing circuit 4 to execute another test mode. The tester, accordingly, holds a very slight quantity of setting value data, and merely supplies a high-speed clock signal for testing the memory chip.

During memory chip testing, it is desirable that the operation of the logic circuit 2A be stopped, so that no noise is generated in the power supply and the memory chip operation is not adversely affected. To that end, the tester sends a test pattern for function macros of an internal processor or the like through the input/output terminals of the logic chip 2 and causes an operation stopping program to be executed. After inputting the test pattern for such an operation stopping program, the tester supplies a test pattern made up of the setting values S46, S47, and S48 for memory chip testing noted earlier.

Figure 7:
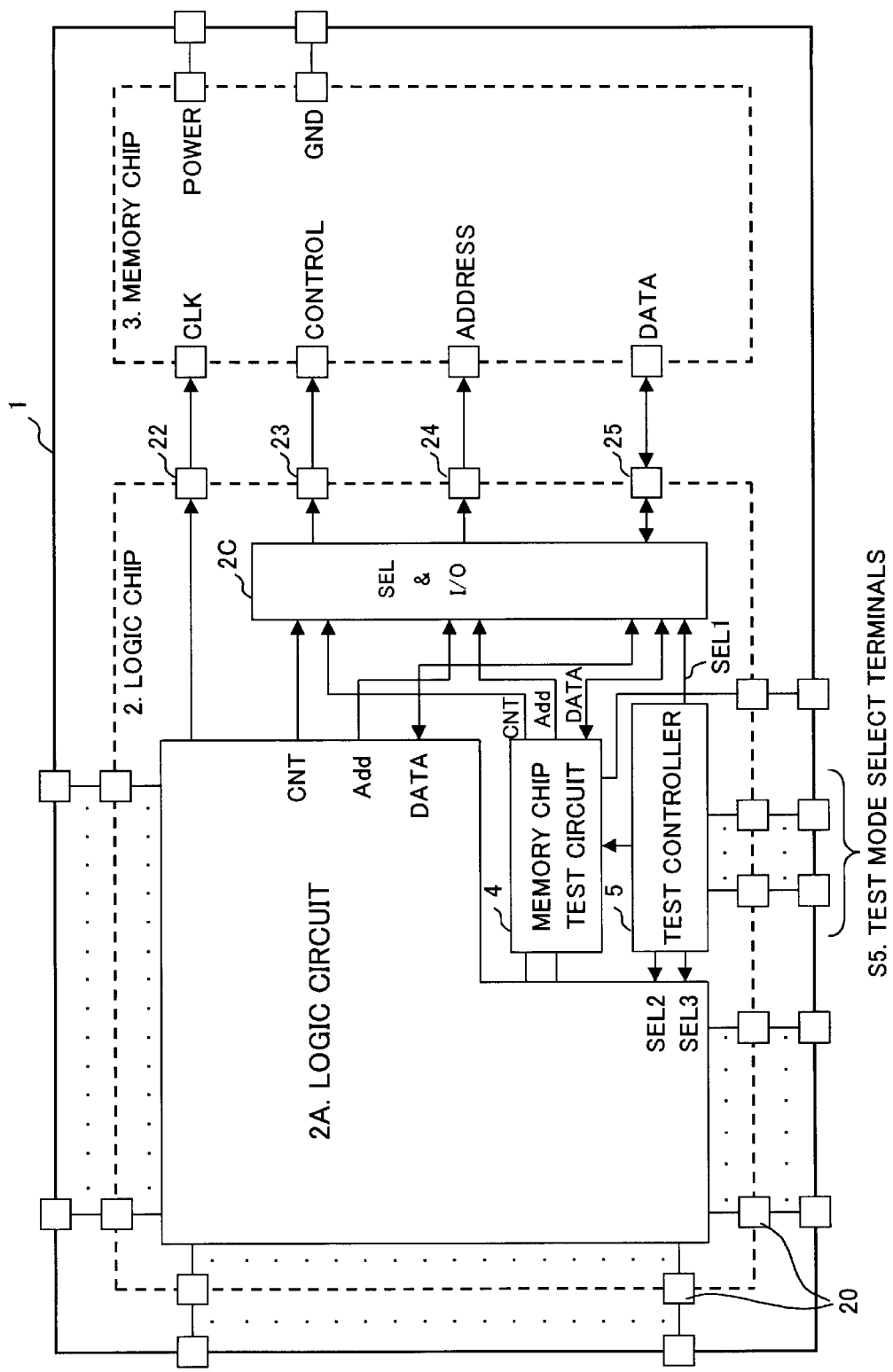
FIG. 7 is a configuration diagram of a semiconductor device in a second embodiment aspect.

FIG. 7 is a configuration diagram of a semiconductor device in a second embodiment aspect. In the case of a semiconductor device having a logic chip 2 and memory chip 3, the logic chip 2 performs data input/output to and from the outside of the package 1, and the memory chip 3 performs data input/output to and from the logic chip 2. That being so, it is necessary to consider tests on the logic circuit 2A inside the logic chip as well as tests on the memory chip testing circuit diagrammed in FIG. 2.

In the embodiment aspect diagrammed in FIG. 7, a test control circuit 5 is provided, making it possible to control both memory chip testing and logic chip testing. In the test control circuit 5, test mode select terminals S5 are provided in the package external terminals, making it possible to control (1) a test mode for the function macros in the logic circuit 2A in the wafer stage, (2) an operation test mode for the random logic and/or function macros in the logic circuit 2A, (3) a test mode for the plurality of memories in the logic circuit 2A, and (4) a test mode for the memory chip 3, respectively. By assigning code not used in the logic chip tests to the select code for the memory chip test mode, there is no need to increase the number of external terminals for the memory chip test mode.

Figure 8:
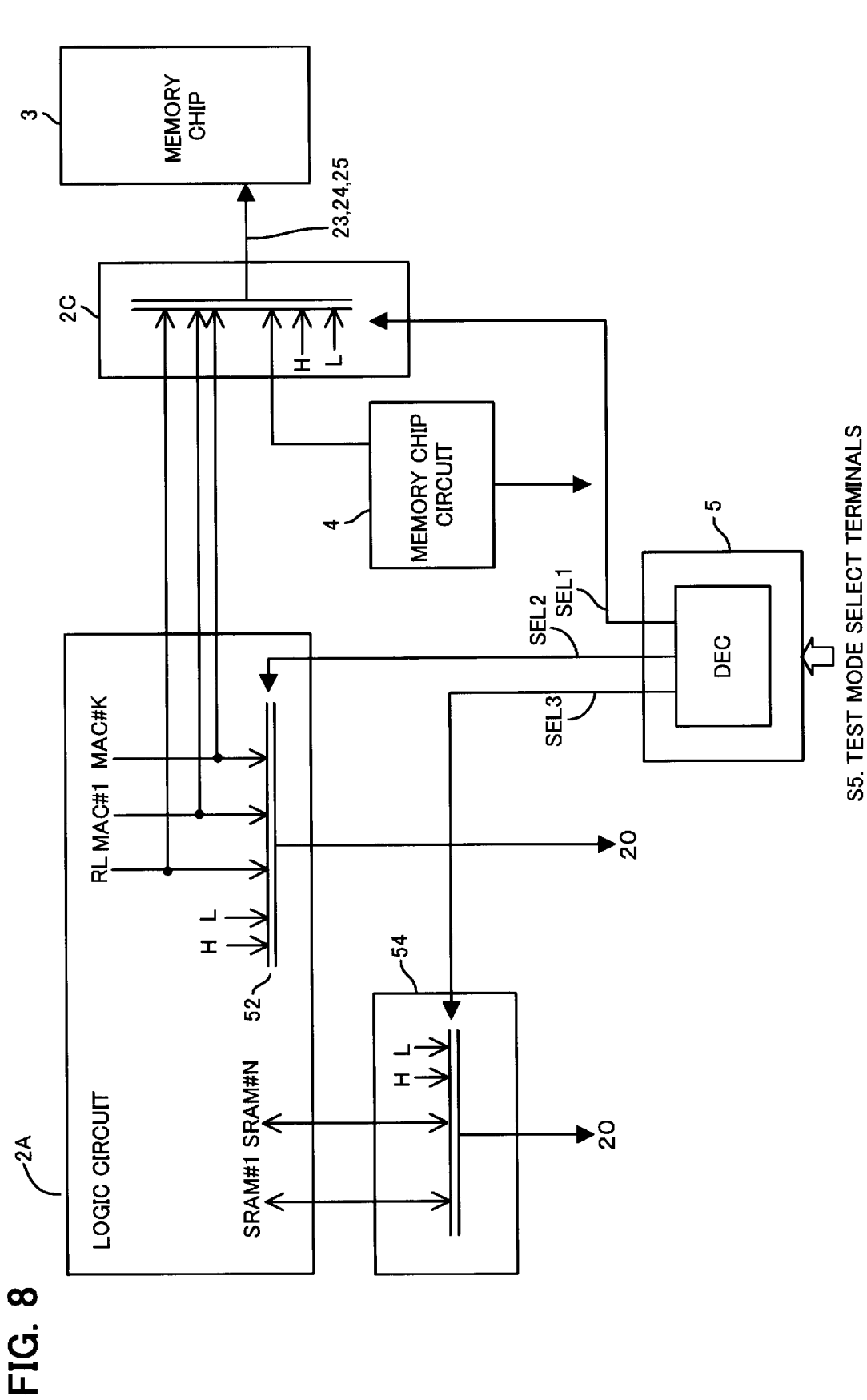
FIG. 8 is a diagram for describing test mode control by a test control circuit.

FIG. 8 is a diagram for describing test mode control by a test control circuit. In FIG. 8, the configuration of the logic chip 2 is diagrammed, excluding the memory chip 3. In the logic circuit 2A are provided function macros having prescribed functions such as DSPs (digital signal processors), a plurality of logic circuit memories such as SRAMS, and other random logic circuitry. Of those, operation tests on the function macros in the wafer stage are conducted by connecting signal lines MAC#1 and MAC#K from the function macros, via the selector input/output circuit 2C, to a tester outside the chip. Accordingly, in response to a first select signal SELL from the test control circuit 5, the selector input/output circuit 2C selects the signal lines MAC#1, MAC#K from the function macros and connects them to the input/output terminals 23, 24, and 25 of the chip.

In the test mode for the memory chip 3 during burn-in testing after mounting on the package, as described earlier, the control signal CNT, address Add, and data DATA and the like from the memory chip testing circuit 4 are selected by the selector input/output circuit 2C. This selection is performed by the first select signal SELL from the test control circuit 5.

Also, the signal lines MAC#1 and MAC#K from the function macros in the logic circuit 2A and/or signal line RL from the random logic circuits are selected by the selector circuit 52, and connected to the input/output terminals 20 of the logic chip 2. This selection is performed by the second select signal SEL2 from the test control circuit 5. Also, the signal lines SRAM#1, SRAM#N from the plurality of memories in the logic circuit 2A are selected by the selector circuit 54 and connected to the input/output terminals of the logic chip. This selection is performed by the third select signal SEL3 from the test control circuit.

As described in the foregoing, the test control circuit 5 decodes the test mode select signals S5 supplied from the outside and generates a select signal corresponding to the set test mode. To the selector circuits 2C, 52, and 54, moreover, a configuration is effected wherewith it is possible to select both H and L levels as well as the line to be selected. The select signal corresponding to the memory chip test mode may also be generated from the memory chip testing circuit 4. In that case, the test mode select signal from the test control circuit 5 is sent to the memory chip testing circuit 4.

Based on the embodiment aspects diagrammed in FIGS. 7 and 8, tests of operations inside the logic chip and of memory chip operations can be set and managed in a unified manner merely by providing a test mode select signal to the test control circuit 5.

Figure 9:
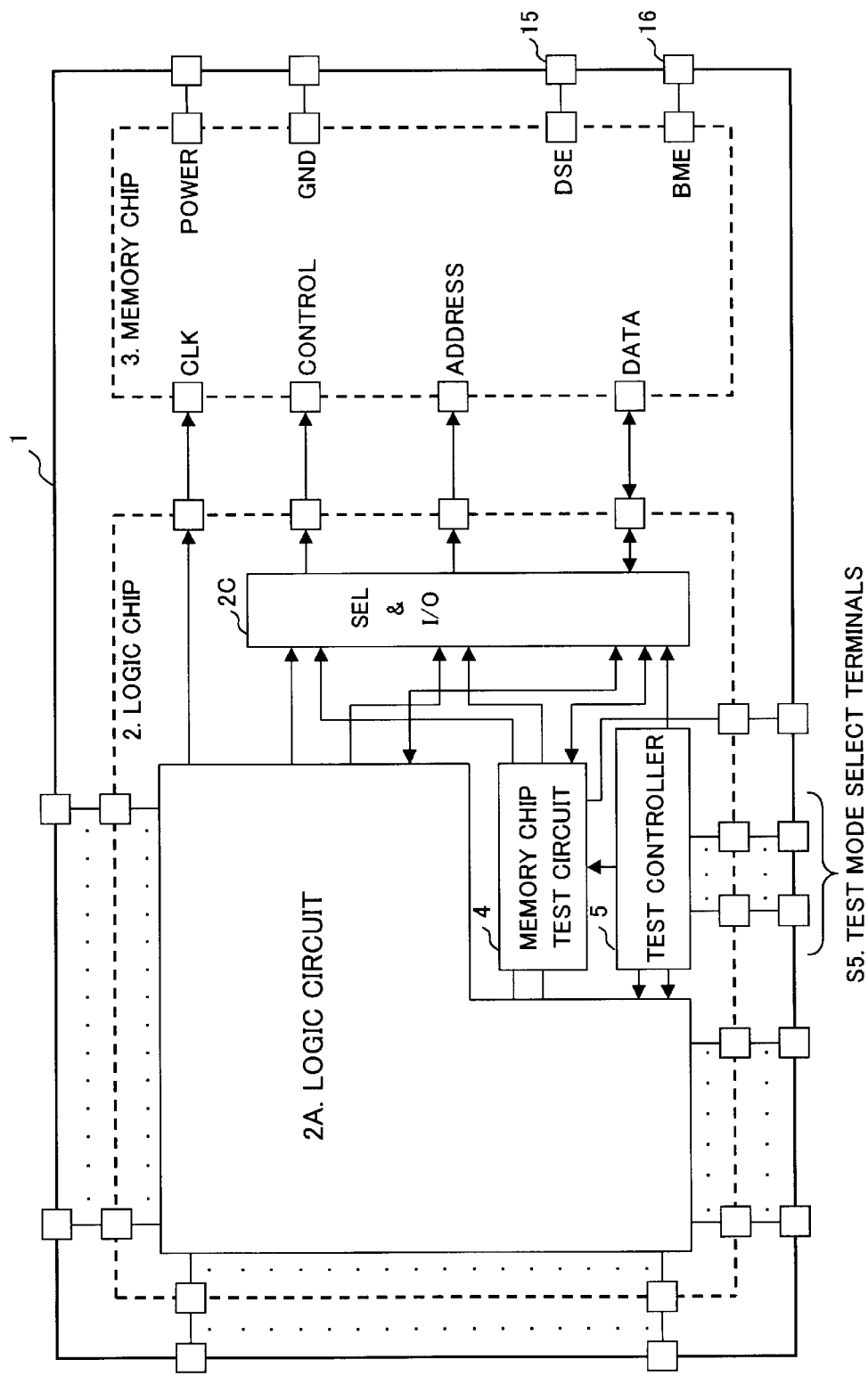
FIG. 9 is a configuration diagram of a semiconductor device in a third embodiment aspect.

FIG. 9 is a configuration diagram of a semiconductor device in a third embodiment aspect. In this example, in the semiconductor device in the second embodiment aspect diagrammed in FIG. 7, a burn-in entry terminal BME and memory non-operate entry terminal DSE are provided in the memory chip 3, and the terminals BME, DSE are connected to the external terminals 16 and 15 of the package 1. The burn-in entry terminal BME directly supplies the burn-in entry signal from the external terminal 16, and, in response thereto, the memory chip 3 performs burn-in operations on its own. The operation mode during burn-in is a mode wherein operations are done while the memory is subjected to stronger stresses than usual; in the case of an SDRAM, this is an operation wherein the active ACT that drives the word line and the precharge PRE that precharges the bit line are repeatedly executed while changing the address. With an MCP semiconductor device, the memory chip 3 signal terminal is not connected to an external terminal of the package 1, wherefore it is not possible to directly control the memory chip 3 during burn-in to execute the burn-in operation mode. Thereupon, as described above, a burn-in entry terminal BME from the outside is provided, and provision is made so that, in response to that entry signal, the memory chip 3 implements the burn-in operation mode on its own.

Also, after mounting on the package, when logic chip 2 operation testing is performed, such as a scan-in scan-out test, for example, by supplying a control signal to the memory via non-operate entry terminal DSE, so that memory chip operation can be stopped, and unexpected signal outputs to the logic chip 2 from the memory chip 3, and the occurrence of noise to the power supply or ground due to operations of the memory chip 3, can be prevented. Thereby the operation of the logic chip 2 can be stabilized, and logic chip 2 operation tests can be performed stably.

Figure 10:
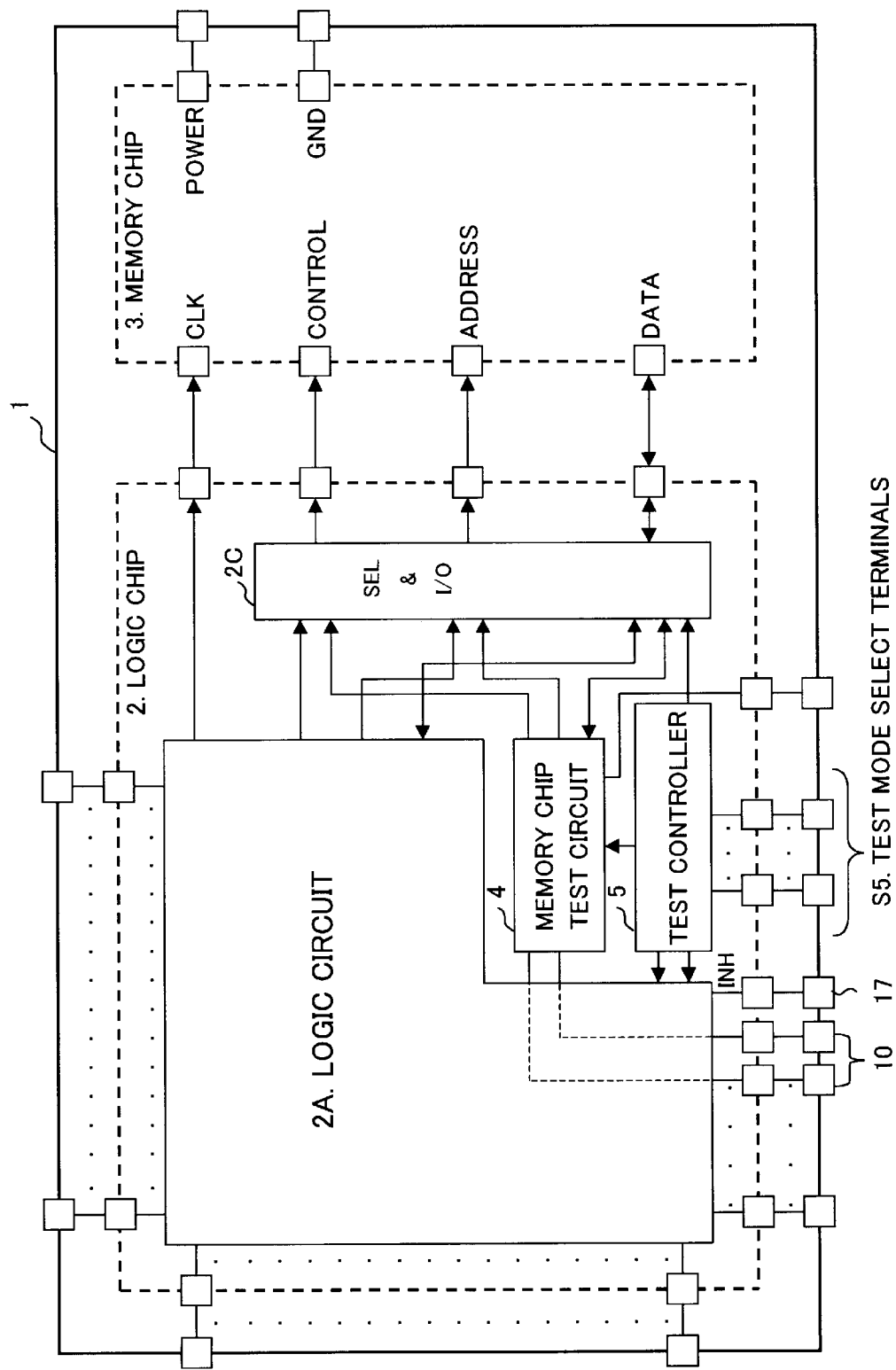
FIG. 10 is a configuration diagram of a semiconductor device in a fourth embodiment aspect.

FIG. 10 is a configuration diagram of a semiconductor device in a fourth embodiment aspect. As described earlier, due to limitations on the external terminals of the package, instead of using dedicated external terminals for the external terminals for supplying operation setting signals to the memory chip testing circuit 4, common use therefor is made of the external terminals 10 connected to the logic chip 2. Accordingly, there is a danger that noise will occur in the power supply or ground due to unexpected operations of the logic chip during memory chip operation testing, and that operation during memory chip testing will be made unstable.

That being so, in the fourth embodiment aspect, an inhibiting terminal INH is provided in the logic chip 2, so that an inhibit control signal can be provided from the external terminal 17 of the package, making it possible to eliminate adverse effects on the memory chip 3 by the operations of the logic chip 2. This inhibiting signal INH is implemented by a reset signal or clock stopping signal, for example. Alternatively, the inhibiting signal may be supplied from the test control circuit 5 instead of being supplied directly from the external terminal 17 of the package.

Figure 11:
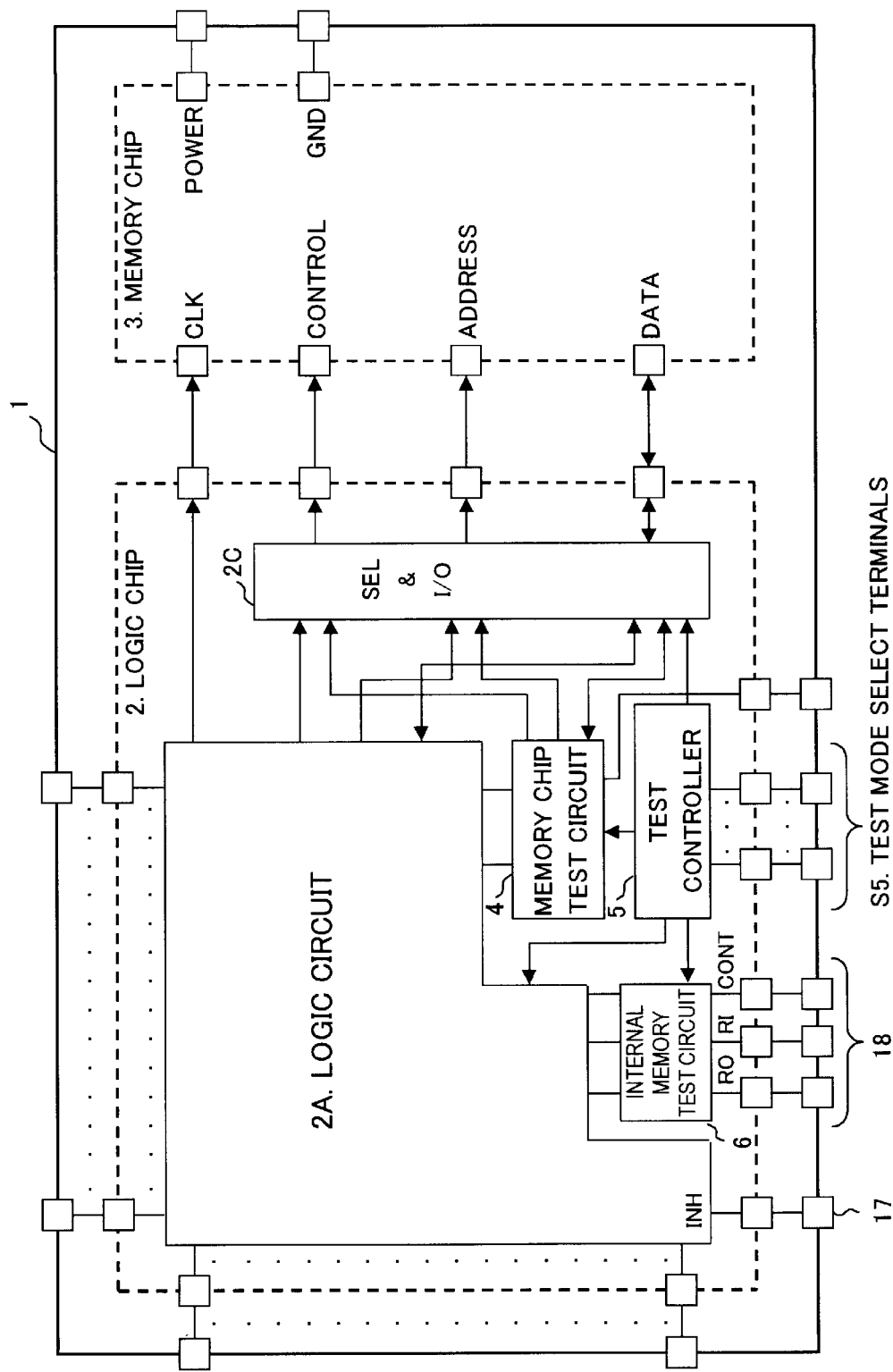
FIG. 11 is a configuration diagram of a semiconductor device in a fifth embodiment aspect.

FIG. 11 is a configuration diagram of a semiconductor device in a fifth embodiment aspect. In this semiconductor device, the configuration is such that, in addition to the inhibiting signal INH of the fourth embodiment aspect, an logic circuitry internal memory testing circuit 6 is separated from the logic circuit 2A. In the logic circuit 2A, a plurality of memories are provided internally. Accordingly, there is a need to subject these memories to operation tests. In the example diagrammed in FIG. 11, the logic circuitry internal memory testing circuit 6 controls the memory operation testing in that logic circuitry 2A. For that reason, the logic chip 2 has a logic circuit internal memory operation test control terminal CONT, input terminal RI, and output terminal RO, connected to external terminals 18 of the package 1. The operations of the internal memories in the logic circuitry are tested via these external terminals 18.

Figure 12:
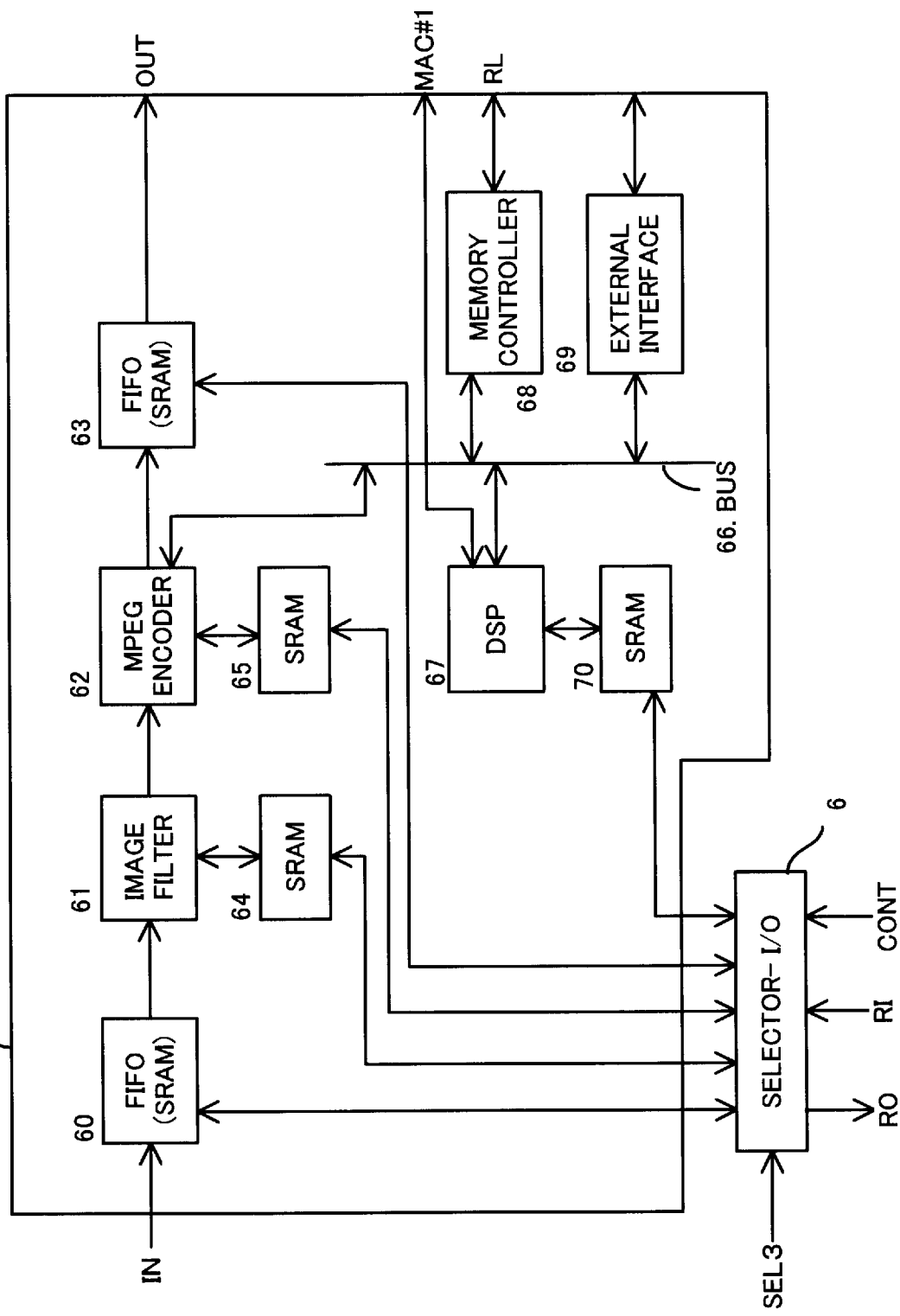
FIG. 12 is a diagram for describing the testing of memory in a logic circuit.

FIG. 12 is a diagram for describing the testing of internal memory in a logic circuit. FIG. 12 shows one example of a logic circuit 2A. This example is a logic circuit that, when given an image input IN from the outside, outputs a MPEG-encoded image output OUT. More specifically, in the logic circuit 2A, an image input IN is input to a FIFO buffer 60 comprising memory, and passed through an image filter 61, whereupon an MPEG encoder 62 encodes in the MPEG format, and the encoded image output OUT is output from a FIFO buffer 63 comprising memory. In conjunction therewith, the MPEG encoder 62, a DSP 67 that is a function macro, a memory controller 68 for the memory chip 3, and an external interface 69 are connected by an internal bus 66. Dedicated memories 64, 65, and 70 are provided for the image filter 61, MPEG encoder 62, and DSP67 respectively. The memory controller 68 is one example of random logic circuit.

In the case of the logic circuit described in the foregoing, it is necessary to perform operation tests on the plurality of memories 60, 63, 64, 65, and 70 inside the logic circuit 2A. For that purpose, signal lines for control signals, addresses, and input/output data and the like to those memories are suitably selected by the logic circuit internal memory testing circuit 6. That is, the logic circuit internal memory testing circuit 6 has selector-input/output circuit functions. In other words, it has the functions of the selector 54 indicated in FIG. 8. In accordance then with the third selector signal SEL3 sent from the test control circuit 5, one or other of the SRAMs in the logic circuit 2A is selected and subjected to operation testing.

By providing the logic circuit internal memory testing circuit 6 separately from the logic circuit 2A, operation tests can be performed on the internal memories using the logic circuit internal memory testing circuit 6, even in a condition wherein operations inside the logic circuit 2A have been stopped by the inhibiting signal INH. Accordingly, operation tests can be performed on internal memory in the logic circuit in parallel with operation tests on the memory chip 3. In conjunction therewith, when a plural number of memories exist inside the logic circuit 2A, time can be saved in performing operation tests on those memories.

Figure 13:
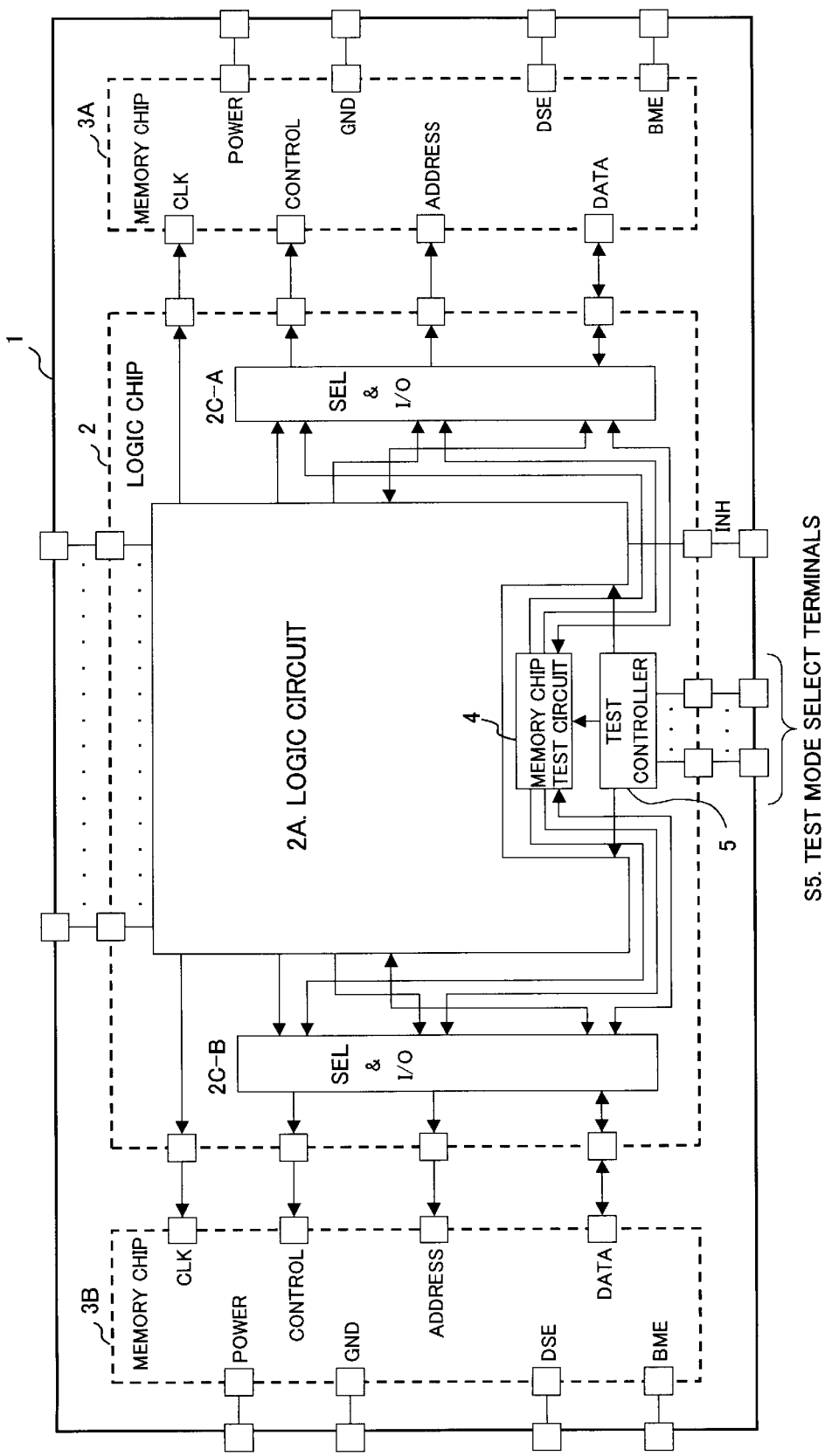
FIG. 13 is a configuration diagram of a semiconductor device in a sixth embodiment aspect.

FIG. 13 is a configuration diagram of a semiconductor device in a sixth embodiment aspect. This is an example wherein a logic circuit 2A and two identical memory chips 3A and 3B are mounted in the package 1. The two memory chips 3A and 3B have the same configuration, wherefore a common memory chip testing circuit 4 for performing operation tests thereon and selector-input/output circuits 2C-A and 2C-B corresponding to those respective memory chips are provided in the logic chip 2. The test control circuit 5, as described earlier, besides the operation tests on the memory chips, also controls operation tests on function macros and/or memory inside the logic circuit 2A.

Operation tests on the memory chips 3A and 3B are performed simultaneously by sending control signals CNT, addresses Add, and data DATA from the memory chip testing circuit 4 to the corresponding memory chips 3A and 3B via the selector-input/output circuits 2C-A and 2C-B. Accordingly, testing time can be cut in half. Also, because each memory chip is provided with a memory non-operate entry terminal DES, as necessary for flaw analysis and the like, it is possible also to place one of the memory chips 3A or 3B in a non-operating state, and perform operation tests only on the other memory chip.

In the example noted above, two test data judgment circuit sets 45 are provided in the memory chip testing circuit 4, corresponding to the two memory chips, and two test result signal terminals are also provided. The other internal circuits 41, 46, 47, and 48 indicated in FIG. 5 may be circuits used in common.

Finally, making reference to FIG. 8, one example of a testing process on a semiconductor device after mounting both chips in the package 1 is described. After loading the package 1 in the tester, DC tests are first performed on the entire semiconductor device. These DC tests include testing the connections between the tester and the semiconductor device, and testing the connections with the bonding pads of the package 1 and the like. After that, operation tests are performed on the random logic inside the logic circuit 2A. That is done by the selector 52 selecting a signal line RL from the random logic circuitry by the second select signal SEL2 from the test control circuit 5, and connecting to the outside. Next, operation tests on the internal memory in the logic circuit are performed. That is done by the selector 54 suitably selecting a signal line SRAM#1 or SRAM#N from the memory by the third select signal SEL3 from the test control circuit 5, and connecting to the outside. After that, operation tests are performed on the functional macros inside the logic circuit. That is done by the selector 52 selecting a signal line MAC#1 or MAC#K from the function macros by the second select signal SEL2 from the test control circuit 5, and connecting to the outside. During the series of logic circuit internal operation tests described above, it is desirable that a control signal be supplied on the non-operate entry terminal of the memory chip to make it non-operable and thus prevent the adverse effects of noise from the memory chip.

Then, last of all, operation tests are performed on the memory chips. In doing that, a memory chip testing circuit signal is selected by the selector-input/output circuit 3C, by the first select signal SEL1 from the test control circuit 5, and sent to the memory chips 3. During the operation tests on the memory chips, an inhibiting signal INH is sent to the logic circuit 2A and the operation of the logic circuit is prevented from adversely affecting memory chip operation.

In the overall testing process described in the foregoing, moreover, operation tests on internal memory in the logic circuit 2A and operation tests on the memory chip may be performed in parallel.

What is claimed is:

1. A semiconductor device having a plurality of chips mounted in a common package, said semiconductor device comprising:
   a logic chip having prescribed functions;
   a memory chip, connected to said logic chip through a memory access terminal, for storing data; and
   wherein said logic chip has a logic circuit having said prescribed functions, and a memory chip testing circuit for performing operation tests on said memory chip.

2. The semiconductor device according to claim 1, wherein said logic chip has a selector-output circuit for selecting either a memory access signal from said logic circuit or a memory testing access signal from said memory chip testing circuit and outputting the selected access signal to said memory access terminal.

3. The semiconductor device according to claim 2, wherein, during ordinary operations, the memory access signal from said logic circuit is supplied to said memory chip via said selector-output circuit, so that an access operation from said logic chip to said memory chip is performed, and, during memory chip testing, the memory testing access signal from said memory chip testing circuit is supplied to said memory chip via said selector-output circuit, so that a test is performed on access operation from said logic chip to said memory chip.

4. The semiconductor device according to claim 2, wherein said memory access signal and said memory testing access signal include a control signal for designating an operation mode in said memory chip, an address signal, and a data signal.

5. The semiconductor device according to claim 2, wherein said selector-output circuit has a selector circuit for selecting either said memory access signal or said memory testing access signal; a holding circuit for holding output of said selector circuit and an output buffer for outputting a signal held by said holding circuit.

6. The semiconductor device according to claim 2, wherein said selector-output circuit has holding circuits for holding said memory access signal and said memory testing access signal, respectively, a selector circuit for selecting either one of outputs of the holding circuits, and an output buffer for outputting output of the selector circuit.

7. The semiconductor device according to claim 2, wherein said logic chip also has a test control circuit for generating, in response to a test mode select signal from outside, a first select signal for selecting either said memory access signal or said memory testing access signal in said selector-output circuit.

8. The semiconductor device according to claim 1, wherein said logic circuit has a plurality of macro circuits and random logic circuits having prescribed functions, and a macro selector for selecting the macro circuits or random logic circuits, and connecting the selected circuits to an external terminal of said package; and said logic chip also has a test control circuit for generating, in response to a test mode select signal from outside, a second select signal for selecting the plurality of macro circuits and random logic circuits in said macro selector.

9. The semiconductor device according to claim 1, wherein said logic circuit has a plurality of logic circuit memories, and a memory selector for selecting said logic circuit memories and connecting the selected logic circuit memory to an external terminal of said package; and said logic chip has a test control circuit for generating, in response to a test mode select signal from outside, a third select signal for selecting said plurality of logic circuit memories in said memory selector.

10. The semiconductor device according to claim 1, wherein said logic circuit has a plurality of logic circuit memories; and said logic chip has a logic circuit memory testing circuit having a memory selector for selecting said logic circuit memories and connecting the selected logic circuit memory to an external terminal of said package, and a test control circuit for generating, in response to a test mode select signal from outside, a third select signal for selecting said plurality of logic circuit memories in said memory selector.

11. The semiconductor device according to claim 10, wherein said logic chip has an inhibiting terminal for stopping internal operations of said logic circuit, and said inhibiting terminal is connected to an external terminal of said package.

12. The semiconductor device according to claim 1, wherein said memory chip testing circuit has a memory chip control circuit for generating a control signal specifying a memory chip operation, an address signal, and write data, according to a test mode; and a test data judgment circuit for comparing read data output by said memory chip in response to a read-out control signal from said memory chip control circuit with an expected value data from said memory chip control circuit, and outputting match or mismatch to outside of said package.

13. The semiconductor device according to claim 12, wherein said memory chip testing circuit further comprises:
    an initialization circuit for initializing said memory chip;
    a self test circuit for testing said test data judgment circuit; and
    a test mode setting circuit for setting a test mode; and
    wherein said initialization circuit, self test circuit, and test mode setting circuit supply respective mode signals to said memory chip control circuit, in accordance with control data from outside said package, and said memory chip control circuit generates said control signal, address signal, and write data in accordance with said mode signal.

14. The semiconductor device according to claim 1, wherein said memory chip has a burn-in entry terminal for causing the interior thereof to enter into a burn-in operation, and said burn-in entry terminal is connected to an external terminal of said package.

15. The semiconductor device according to claim 1, wherein said memory chip has a memory non-operate entry terminal for entering into a non-operating mode in which no output signal is output to said logic chip, and said memory non-operate entry terminal is connected to an external terminal of said package.

16. The semiconductor device according to claim 1, wherein said logic chip has an inhibiting terminal for stopping internal operations of said logic circuit, and said inhibiting terminal is connected to an external terminal of said package.

17. A semiconductor device according to claim 1, wherein said memory chip has no terminals connected to the common package other than a power supply terminal or an operation setting terminal.

18. A semiconductor device according to claim 1, wherein said logic chip has at least one terminal of a plurality of terminals connected to the common package, the plurality of terminals including a clock terminal, a control signal terminal, an address terminal and a data terminal.

\* \* \* \* \*